(12) United States Patent
Sidi et al.

(10) Patent No.: US 8,149,964 B2
(45) Date of Patent: Apr. 3, 2012

(54) SYMBOL SCALING WITH AUTOMATIC GAIN CONTROL FOR WIRELESS COMMUNICATION

(75) Inventors: Jonathan Sidi, San Francisco, CA (US); Ketan N. Patel, Ann Arbor, MI (US)

(73) Assignee: QUALCOMM, Incorporated, San Diego, CA (US)

( * ) Notice: Subject to any disclaimer, the term of this patent is extended or adjusted under 35 U.S.C. 154(b) by 937 days.

(21) Appl. No.: 11/768,164

(22) Filed: Jun. 25, 2007

(65) Prior Publication Data

US 2008/0165904 A1    Jul. 10, 2008

Related U.S. Application Data

(60) Provisional application No. 60/883,526, filed on Jan. 5, 2007.

(51) Int. Cl.
    *H04L 27/08* (2006.01)
(52) U.S. Cl. ............ 375/345; 455/234.2; 455/239.1
(58) Field of Classification Search ........... 375/340, 375/345; 455/232.1, 234.1, 234.2, 235.1, 455/239.1, 250.1, 226.1, 226.2
See application file for complete search history.

(56) References Cited

U.S. PATENT DOCUMENTS

| | | | |
|---|---|---|---|
| 7,236,514 B2 * | 6/2007 | Bottomley et al. | 375/147 |
| 7,570,934 B2 * | 8/2009 | Shalash | 455/240.1 |
| 7,697,644 B2 * | 4/2010 | Yousef et al. | 375/345 |
| 2004/0017865 A1 | 1/2004 | Litwin, Jr. et al. | |
| 2008/0130801 A1 * | 6/2008 | Wang | 375/345 |

FOREIGN PATENT DOCUMENTS

| | | |
|---|---|---|
| CN | 1706112 A | 12/2005 |
| JP | 2003520463 | 7/2003 |
| JP | 2006503511 | 1/2006 |
| WO | WO0070836 | 11/2000 |
| WO | WO2004038953 | 5/2004 |
| WO | WO2006042326 | 4/2006 |

OTHER PUBLICATIONS

International Search Report and Written Opinion—PCT/US2008/050308, International Search Authority—European Patent Office—Jul. 17, 2008.
Translation of Office Action in Japan application 2009-544998 corresponding to U.S. Appl. No. 11/768,164.

* cited by examiner

*Primary Examiner* — Dac V Ha
(74) *Attorney, Agent, or Firm* — Kenyon S. Jenckes; William M. Hooks

(57) ABSTRACT

Techniques for scaling symbols to account for large abrupt changes in received power at a user equipment (UE) are described. The UE performs AGC on received samples to obtain input samples. The UE processes (e.g., CDMA demodulates) the input samples to obtain first symbols. The UE determines the power of the input samples and derives a symbol gain based on (e.g., inversely related to) the power of the input samples. The UE scales the first symbols with the symbol gain to obtain detected data symbols having approximately constant amplitude, even with large abrupt changes in the power of the input samples. The UE estimates signal amplitude and noise variance based on the detected data symbols, computes LLRs for code bits of the detected data symbols based on the signal amplitude and noise variance, and decodes the LLRs to obtain decoded data.

26 Claims, 8 Drawing Sheets

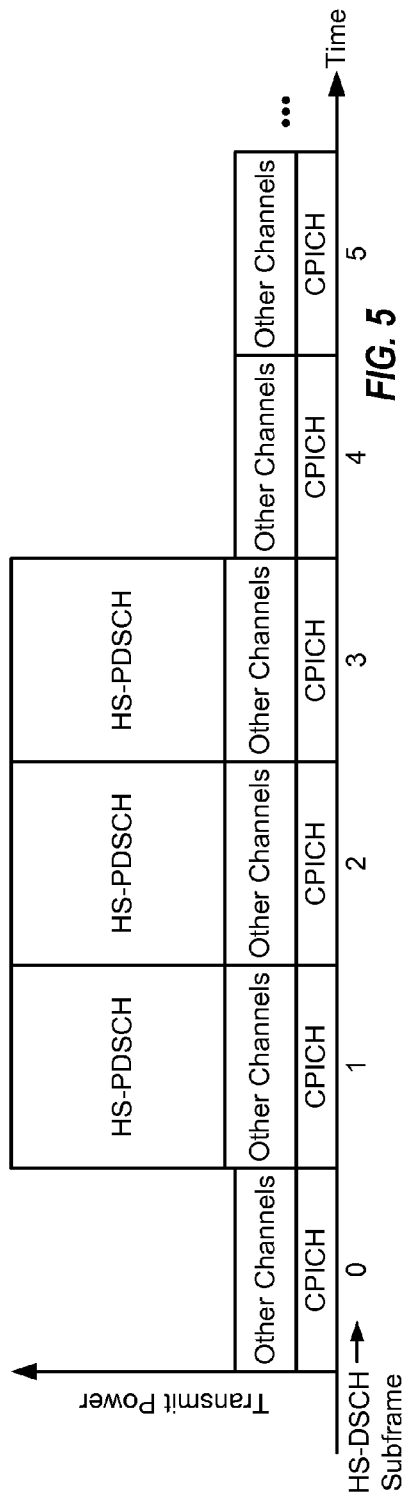
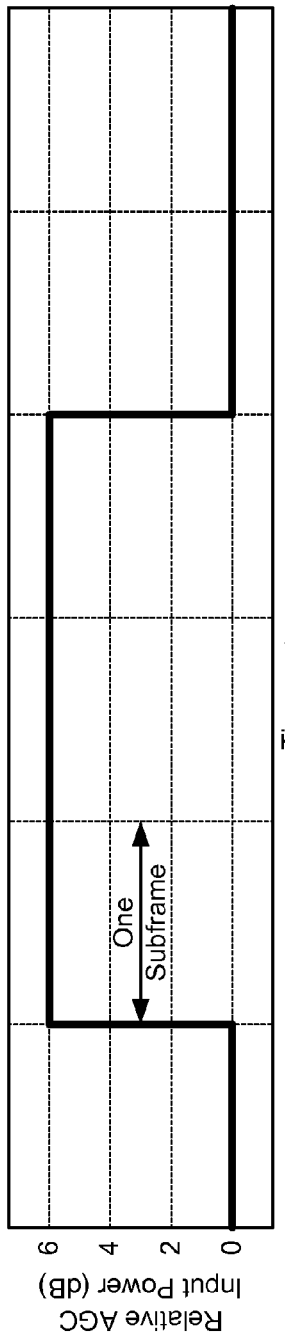
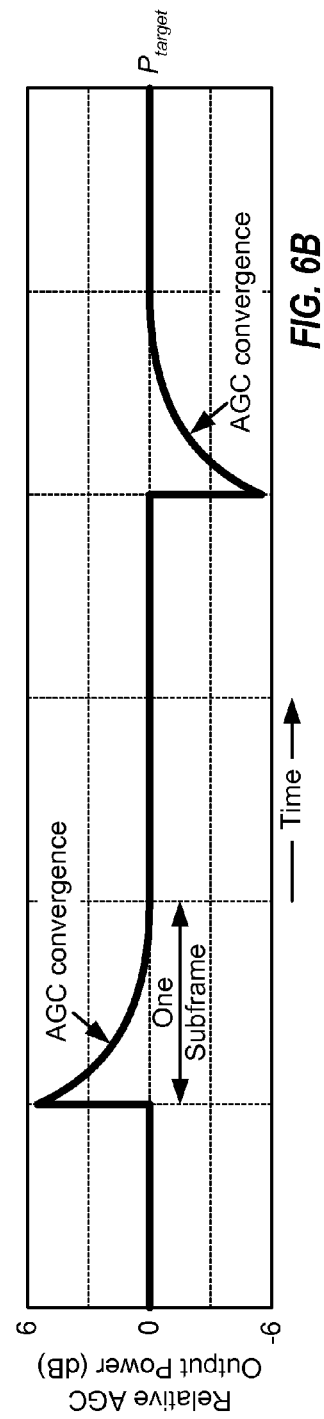
FIG. 5
FIG. 6A
FIG. 6B

SYMBOL SCALING WITH AUTOMATIC GAIN CONTROL FOR WIRELESS COMMUNICATION

CLAIM OF PRIORITY UNDER 35 U.S.C. §119

The present Application for Patent claims priority to Provisional Application No. 60/883,526 entitled "AGC based HSDPA scaling" filed Jan. 5, 2007, and assigned to the assignee hereof and hereby expressly incorporated by reference herein.

BACKGROUND

1. Field

The present disclosure relates generally to communication, and more specifically to techniques for processing symbols for wireless communication.

2. Background

In a wireless communication system, a transmitter may process (e.g., encode, interleave, and symbol map) traffic data to obtain data symbols. The transmitter may further process the data symbols to generate a modulated signal and then transmit this signal via a wireless channel. The transmitted signal may be distorted by the wireless channel and further degraded with noise and interference.

A receiver may receive the transmitted signal and process the received signal to obtain samples. The receiver may then process the samples to obtain detected data symbols, which are estimates of the data symbols sent by the transmitter. The receiver may compute log-likelihood ratios (LLRs) for bits of the data symbols based on the detected data symbols and may then process (e.g., deinterleave and decode) the LLRs to obtain decoded data.

Decoding performance may be dependent on the quality of the LLRs computed based on the detected data symbols. The quality of the LLRs may in turn be dependent on various factors such as fluctuations in the amplitude of the detected data symbols. An automatic gain control (AGC) loop may be used to achieve approximately constant power for the samples in order to obtain approximately constant amplitude for the detected data symbols. However, the AGC loop may not be effective in certain operating scenarios, as described below.

SUMMARY

Techniques for scaling symbols to account for large abrupt changes in received power are described herein. These techniques may be used to combat fluctuations in received power that are not appropriately compensated by AGC. The techniques may be able to provide detected data symbols having approximately constant amplitude (or less amplitude variations), which may improve decoding performance. The techniques may be performed by a user equipment (UE) for downlink transmission from a Node B.

In one design, the UE may perform AGC on received samples to obtain input samples. The UE may then process (e.g., CDMA demodulate) the input samples to obtain first symbols. The UE may determine the power of the input samples and derive a symbol gain based on (e.g., inversely related to) the power of the input samples. The UE may then scale the first symbols with the symbol gain to obtain detected data symbols having approximately constant amplitude, even with large abrupt changes in the power of the input samples. The UE may estimate signal amplitude and noise variance based on the detected data symbols, compute LLRs for code bits of the detected data symbols based on the signal amplitude and noise variance, and decode the LLRs to obtain decoded data. By maintaining approximately constant amplitude for the detected data symbols, the estimation of the signal amplitude and noise variance, the LLR computation, and the decoding may all improve.

Various aspects and features of the disclosure are described in further detail below.

BRIEF DESCRIPTION OF THE DRAWINGS

FIG. 5 shows transmit power at the Node B with intermittent scheduling.

FIGS. 6A and 6B show AGC input power and AGC output power, respectively, for the scenario shown in FIG. 5.

DETAILED DESCRIPTION

The scaling techniques described herein may be used for various wireless communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, etc. A CDMA system may implement a radio technology such as Universal Terrestrial Radio Access (UTRA), cdma2000, etc. UTRA includes Wideband CDMA (W-CDMA) and Low Chip Rate (LCR). cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Flash-OFDM®, etc. UTRA, E-UTRA, and GSM are part of Universal Mobile Telecommunication System (UMTS). UTRA, E-UTRA, GSM and UMTS are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain aspects of the techniques are described below for W-CDMA, and 3GPP terminology is used in much of the description below.

Figure 1:
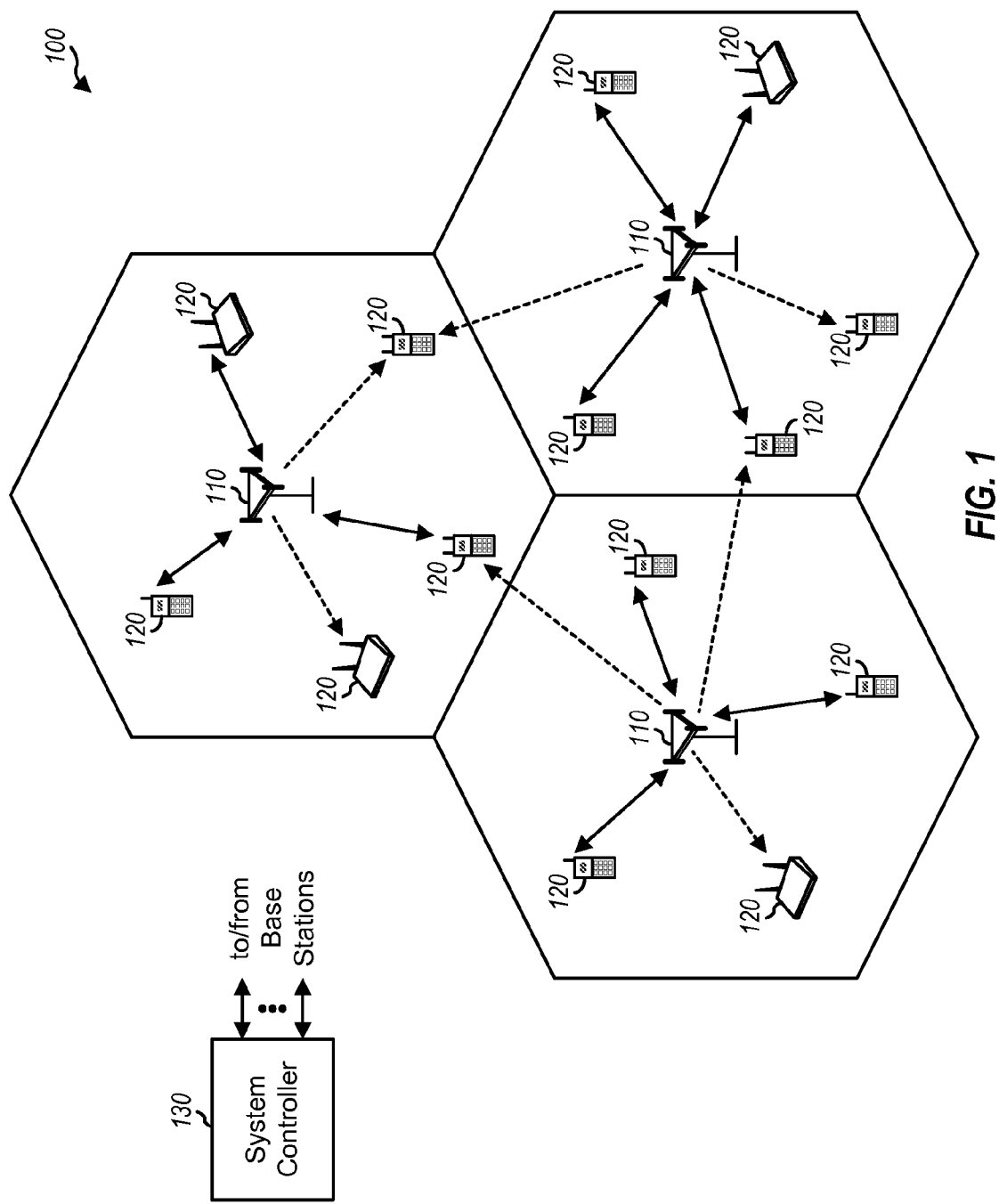
FIG. 1 shows a wireless communication system.

FIG. 1 shows a wireless communication system 100 that includes a number of Node Bs 110. A Node B is a fixed station that communicates with the UEs. A Node B may also be referred to as a base station, an evolved Node B (eNode B), an access point, etc. Each Node B provides communication coverage for a particular geographic area and supports communication for the UEs located within the coverage area. As used herein, a "cell" can refer to the smallest coverage area in the system and/or a Node B responsible for this coverage area, depending on the context in which the term is used. A cell may also be referred to as a cell-sector, a sector, etc. A system controller 130 may couple to the Node Bs and provide coordination and control for these Node Bs. System controller 130 may be a single network entity or a collection of network entities.

UEs 120 may be dispersed throughout system 100, and each UE may be stationary or mobile. A UE may also be referred to as a mobile station, a terminal, an access terminal, a subscriber unit, a station, etc. A UE may be a cellular phone, a personal digital assistant (PDA), a wireless device, a handheld device, a wireless modem, a laptop computer, etc. A UE may communicate with one or more Node Bs on the downlink and/or uplink at any given moment. The downlink (or forward link) refers to the communication link from the Node Bs to the UEs, and the uplink (or reverse link) refers to the communication link from the UEs to the Node Bs. A UE may actively communicate with a Node B (as shown by a solid with double arrows) and/or may receive pilot and signaling from a Node B (as shown by a dashed line with a single arrow).

Figure 2:
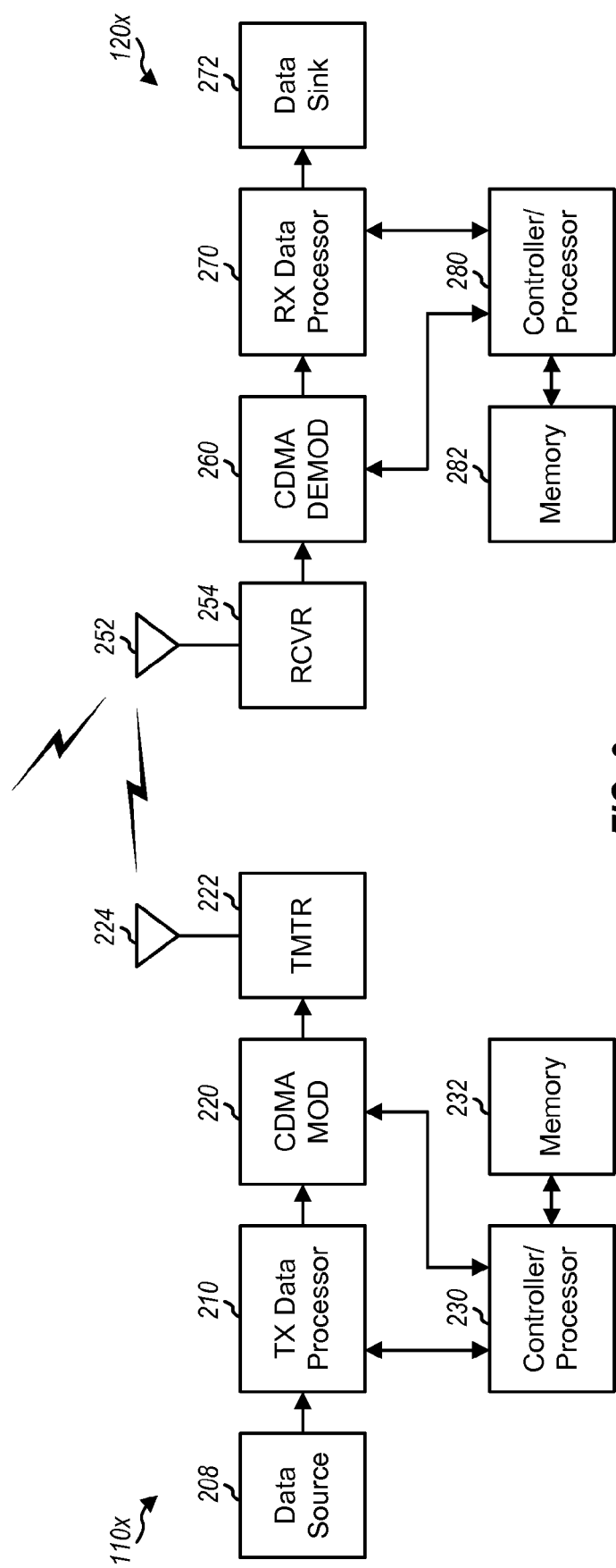
FIG. 2 shows a block diagram of a Node B and a UE.

FIG. 2 shows a block diagram of a design of a Node B 110x and a UE 120x, which are one of Node Bs 110 and one of UEs 120 in FIG. 1. At Node B 110x, a transmit (TX) data processor 210 receives traffic data from a data source 208 for all UEs being served and processes (e.g., encodes, interleaves, rate matches, and symbol maps) the traffic data to obtain data symbols. Processor 210 also receives signaling from a controller/processor 230 and processes the signaling to obtain signaling symbols. As used herein, a data symbol is a symbol for data, a signaling symbol is a symbol for signaling, a pilot symbol is a symbol for pilot, and a symbol is typically a complex value. The data, signaling, and pilot symbols may be modulation symbols from M-ary phase shift keying (M-PSK), M-ary quadrature amplitude modulation (M-QAM), etc. Pilot is data that is known a priori by both the Node B and the UE.

A CDMA modulator (MOD) 220 processes the data, signaling, and pilot symbols and provides output chips to a transmitter (TMTR) 222. For W-CDMA, the processing by CDMA modulator 220 may include (1) spreading the data, signaling, and pilot symbols with different channelization codes to send the traffic data, signaling, and pilot on different physical channels, (2) scaling the channelized chips for each physical channel based on the amount of transmit power to use for that physical channel, (3) combining the scaled chips for all physical channels, and (4) scrambling the combined chips with a scrambling sequence for the Node B cell to obtain the output chips. Transmitter 222 processes (e.g., converts to analog, amplifies, filters, and frequency upconverts) the output chips and generates a downlink signal, which is transmitted via an antenna 224.

At UE 120x, an antenna 252 receives the downlink signals from Node B 110x and other Node Bs and provides a received signal to a receiver (RCVR) 254. Receiver 254 processes (e.g., filters, amplifies, frequency downconverts, and digitizes) the received signal and provides received samples to a CDMA demodulator (DEMOD) 260. CDMA demodulator 260 processes the received samples (e.g., with a rake receiver and/or an equalizer) in a manner complementary to the processing by CDMA modulator 220 and provides detected data symbols, which are estimates of the data symbols sent by Node B 110x to UE 120x. A receive (RX) data processor 270 processes (e.g., computes LLRs, deinterleaves, and decodes) the detected data symbols and provides decoded data to a data sink 272. In general, the processing by CDMA demodulator 260 and RX data processor 270 is complementary to the processing by CDMA modulator 220 and TX data processor 210, respectively, at Node B 110x.

Controllers/processors 230 and 280 direct the operation of various processing units at Node B 110x and UE 120x, respectively. Memories 232 and 282 store data and program codes for Node B 110x and UE 120x, respectively.

Figure 3:
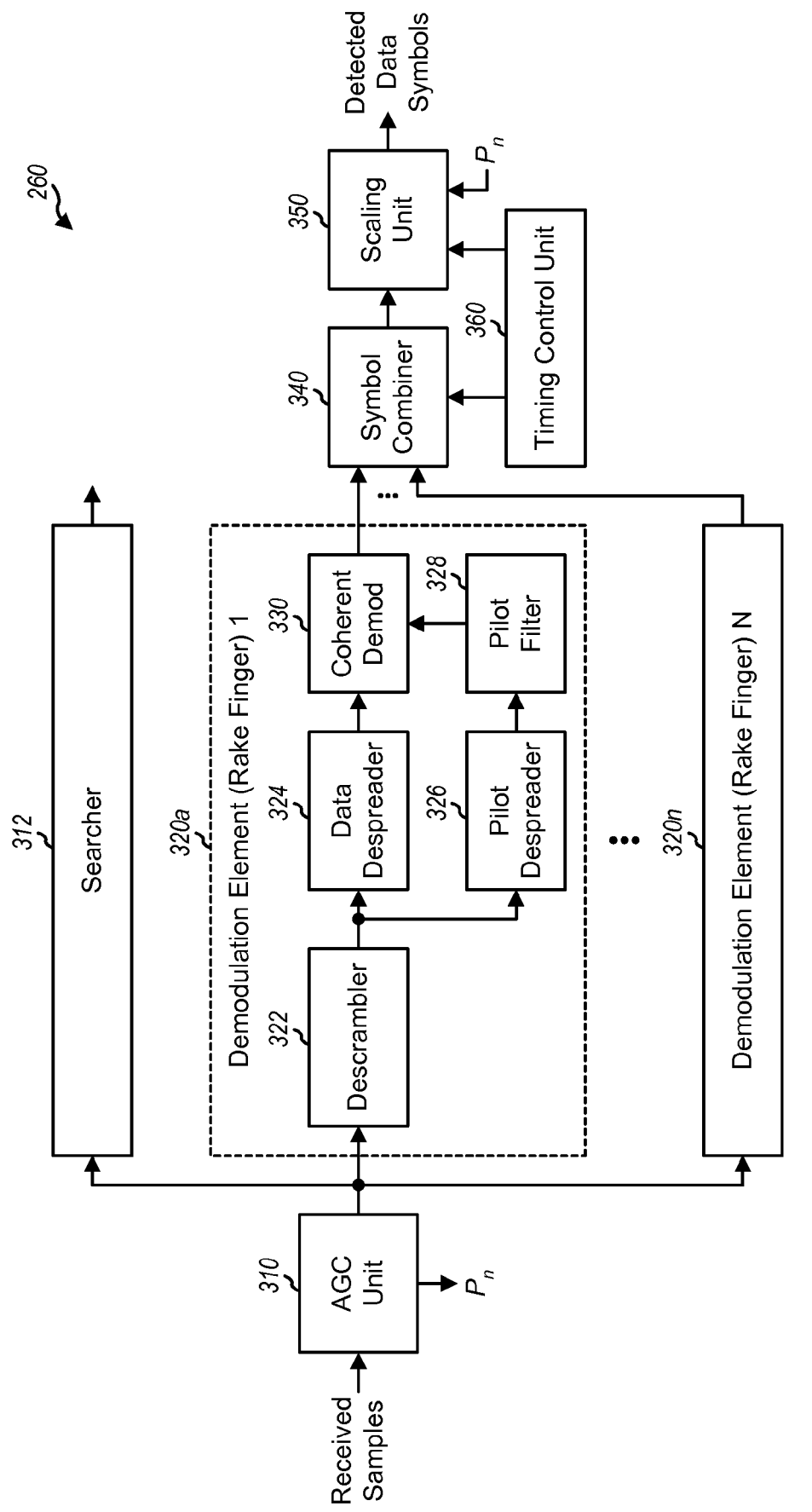
FIG. 3 shows a block diagram of a CDMA demodulator at the UE.

FIG. 3 shows a block diagram of a design of CDMA demodulator 260 at UE 120x in FIG. 2. In this design, CDMA demodulator 260 implements a rake receiver that includes a searcher 312 and N demodulation elements (or rake fingers) 320a through 320n, where N may be any integer value one or greater. Searcher 312 may search for strong multipaths in the received signal and may provide the strength and timing of each found multipath that meets one or more criteria. Searcher 312 may search for pilots transmitted by the Node Bs to find the multipaths. One rake finger 320 may be assigned to process each multipath of interest, e.g., as determined by controller 280 based on the signal strength and timing provided by searcher 312.

In the design shown in FIG. 3, an AGC unit 310 obtains the received samples from receiver 254, performs AGC on the received samples as described below, and provides input samples having approximately constant power in most operating scenarios. In general, the sample rate may be equal to the chip rate or multiple times the chip rate, e.g., twice the chip rate or chipx2. Although not shown in FIG. 3, a sample buffer may buffer the received samples and/or the input samples for subsequent processing by searcher 312 and rake fingers 320.

Within rake finger 320a, which is assigned to process a multipath for a particular Node B, a descrambler 322 descrambles the input samples from AGC unit 310 with a scrambling sequence and provides descrambled samples. The scrambling sequence is for the Node B assigned to rake finger 320a and starts at a time determined by the arrival time of the multipath being processed. A data despreader 324 despreads the descrambled samples with a channelization code for a physical channel being received and provides despread data symbols. A pilot despreader 326 despreads the descrambled samples with a channelization code for a pilot channel and provides despread pilot symbols. A filter 328 filters the despread pilot symbols and provides pilot estimates. A coherent demodulator/detector 330 performs coherent demodulation of the despread data symbols with the pilot estimates and provides demodulated symbols for the multipath assigned to rake finger 320a. Coherent demodulator 330 may perform a complex multiply of each despread data symbol with a pilot estimate for that symbol to obtain a corresponding demodulated symbol.

A symbol combiner 340, which is also referred to as a deskew buffer, receives the demodulated symbols from all rake fingers assigned to process different multipaths. Combiner 340 time-aligns (or deskews) the demodulated symbols for all multipaths to be combined, combines the time-aligned symbols, and provides combined symbols for these multipaths. Combiner 340 may combine all multipaths for each downlink transmission sent to UE 120x and provides combined symbols for that downlink transmission. Combiner 340 may include a buffer to store the demodulated symbols prior to combining and/or a buffer to store the combined symbols until these symbols are read out. A scaling unit 350 receives and scales the combined symbols as described below and provides the detected data symbols to RX data processor 270. A timing control unit 360 directs reading out of the combined symbols from combiner 340 and computation of a symbol gain by scaling unit 350 so that the appropriate symbol gain is applied to each symbol from combiner 340. The symbol gain may also be referred to as a scaling gain, etc.

3GPP Release 5 and later supports High-Speed Downlink Packet Access (HSDPA), which is a set of channels and procedures that enable high-speed packet data transmission on the downlink. For HSDPA, a Node B sends traffic data on a High Speed Downlink Shared Channel (HS-DSCH), which is a downlink transport channel that is shared by the UEs in both time and code. The HS-DSCH may carry data for zero, one or multiple UEs in each subframe of 2 millisecond (ms). The data for the HS-DSCH is sent on a High Speed Physical Downlink Shared Channel (HS-PDSCH), and signaling for the HS-PDSCH is sent on a Shared Control Channel for HS-DSCH (HS-SCCH).

Figure 4:
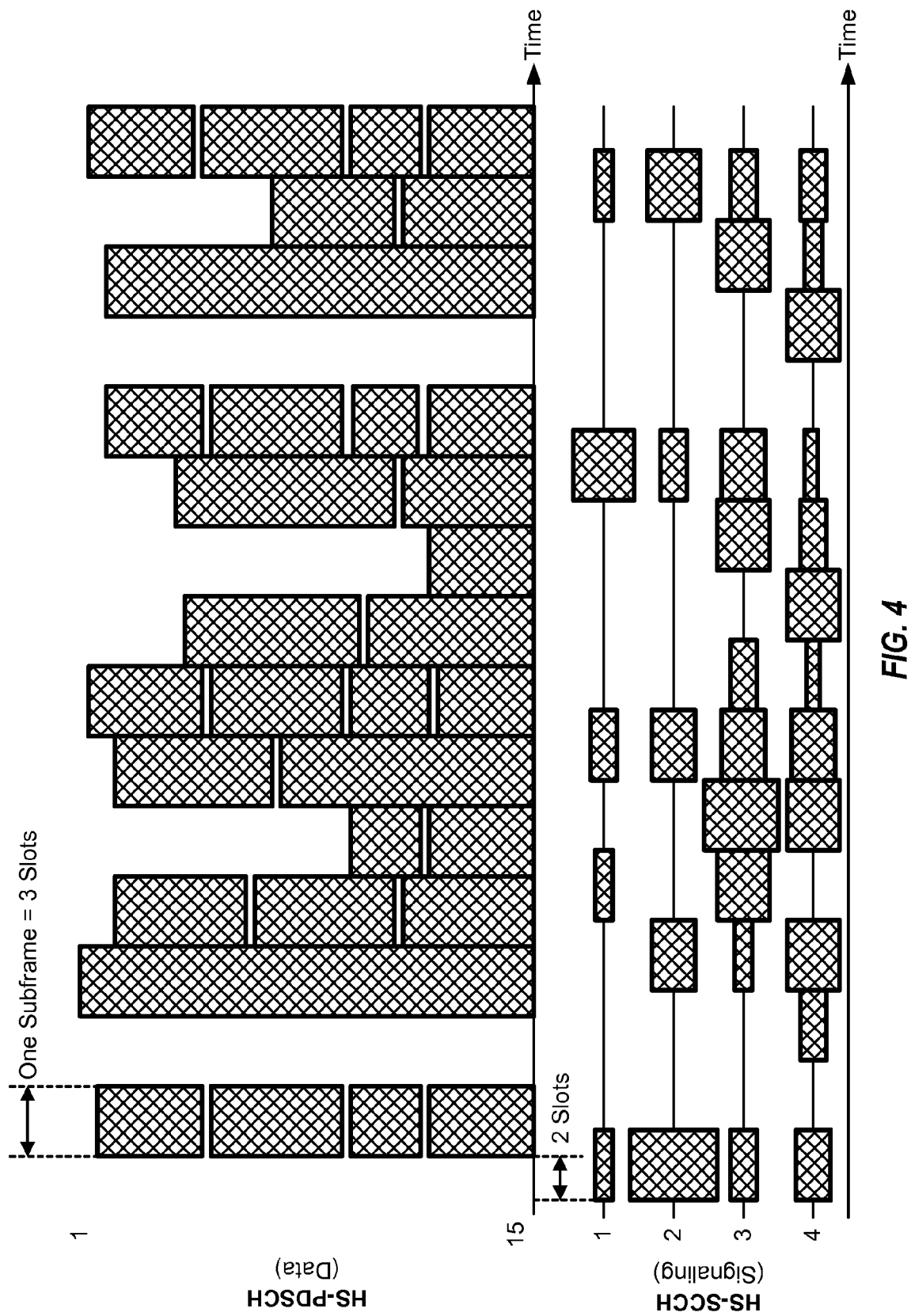
FIG. 4 shows downlink transmission by the Node B for HSDPA.

FIG. 4 shows an example downlink transmission by Node B 110x for HSDPA. In this example, up to fifteen 16-chip channelization codes with indices of 1 through 15 may be used for the HS-PDSCH, and up to four 128-chip channelization codes with indices of 1 through 4 may be used for the HS-SCCH. Node B 110x schedules UEs for data transmission on the HS-DSCH in each subframe. Node B 110x sends signaling for the scheduled UEs on the HS-SCCH and sends data for these UEs on the HS-PDSCH. A subframe covers three slots. The signaling for each scheduled UE is sent on the HS-SCCH two slots earlier than the data sent on the HS-PDSCH for the UE. Each UE that might receive data on the HS-DSCH processes the HS-SCCH in each subframe to determine whether signaling has been sent to that UE. Each UE that receives signaling on the HS-SCCH would then process the HS-PDSCH to recover the data sent to the UE.

In the example shown in FIG. 4, Node B 110x may send data to up to four UEs in each subframe using (1) up to four 128-chip channelization codes to send signaling to these UEs on the HS-SCCH and (2) up to fifteen 16-chip channelization codes to send data to these UEs on the HS-PDSCH. Node B 110x may use all of the cell power available to the Node B for transmission to the scheduled UEs in each subframe. The amount of cell power used by Node B 110x may vary widely from subframe to subframe, as shown in FIG. 4.

FIG. 5 shows an example transmit power profile for Node B 110x with intermittent scheduling. In this example, Node B 110x does not transmit the HS-PDSCH in subframe 0. Node B 110x may use 25% of the total cell power to transmit a common pilot channel (CPICH) and other physical channels in subframe 0 for an unloaded cell. Node B 110x transmits the HS-PDSCH, CPICH, and other physical channels using 100% of the total cell power in each of subframes 1, 2 and 3 for a fully loaded cell. For this example, the transmit power at Node B 110x increases by approximately 6 decibels (dB) from subframe 0 to subframe 1. Node B 110x does not transmit the HS-PDSCH in each of subframes 4 and 5. The cell power decreases by approximately 6 dB from subframe 3 to subframe 4

To support high data rate, Node B 110x may transmit the HS-PDSCH with a large portion of the total cell power, as shown in FIG. 5. Consequently, the cell power for Node B 110x may vary significantly at the beginning and the end of an HSDPA transmission on the HS-PDSCH. The change in cell power due to HS-DSCH scheduling may be 6 dB or possibly more and may occur as frequently as once per subframe.

The total received power at UE 120x may be given as:

$$I_0 = I_{or} + I_{oc},\quad\text{Eq (1)}$$

where
$I_{or}$ is the received power for serving Node B 110x,
$I_{oc}$ is the received power for other Node Bs plus thermal noise and receiver noise at UE 120x, and
$I_0$ is the total received power at UE 120x.

For a high geometry scenario, $I_{or}$ may be much larger than $I_{oc}$, and $I_0$ may be dominated by $I_{or}$. In this case, the total received power at UE 120x may fluctuate widely, especially at cell boundary, when the cell power of serving Node B 110x varies widely.

AGC unit 310 in FIG. 3 may attempt to account for fluctuations in the received power at UE 120x. AGC unit 310 may scale the received samples from receiver 254 with an AGC gain selected such that the power of the samples outputted by AGC unit 310 is close to a target power $P_{target}$. AGC unit 310 may update the AGC gain with a loop filter having a particular response time. Hence, AGC unit 310 may be unable to instantaneously handle a large abrupt change in received power at UE 120x. AGC unit 310 may take some amount of time to adjust and converge the AGC gain to a proper value determined by the change in received power. The settling time of AGC unit 310 is determined by the design of the loop filter and, in one design, is on the order of one half subframe.

FIG. 6A shows the power of the received samples at the input of AGC unit 310 for the scenario shown in FIG. 5. The cell power may increase by 6 dB for three subframes and then reduce to the original level. In high geometry scenario, the sudden increase in cell power due to HSDPA scheduling may be observed in its entirety by UE 120x.

FIG. 6B shows the power of the samples at the output of AGC unit 310 for the scenario shown in FIG. 5. In this example, the AGC output power is initially at the target value, which is denoted as 0 dB. When the AGC input power jumps by 6 dB, the AGC output power may jump correspondingly. The AGC output power then converges to the target value with a time constant of τ.

During the transient period before AGC unit 310 settles, the amplitude of the demodulated symbols from rake fingers 320 may change over time and follow the transient on the AGC output power. The changing amplitude of the demodulated symbols may degrade decoding performance, especially for data symbols from 16-QAM or higher order QAM. This is because the mapping of the detected data symbols to LLRs for 16-QAM or higher-order QAM may rely heavily on an assumption of constant signal amplitude for the detected data symbols. Changing amplitude of the detected data symbols due to large abrupt changes in received power at UE 120x may adversely impact the LLR mapping, which may then degrade decoding performance. In certain instances, one or more subframes of HS-DSCH data may be consistently decoded in error until the AGC settles.

In an aspect, symbols within CDMA demodulator 260 may be scaled to account for fluctuations in received power at UE 120x that are not corrected by AGC unit 310. This scaling may be able to provide detected data symbols having approximately constant amplitude (or less amplitude variations) during a period in which LLR mapping parameters are estimated, which may improve decoding performance. The scaling may be performed in various manners.

Figure 7:
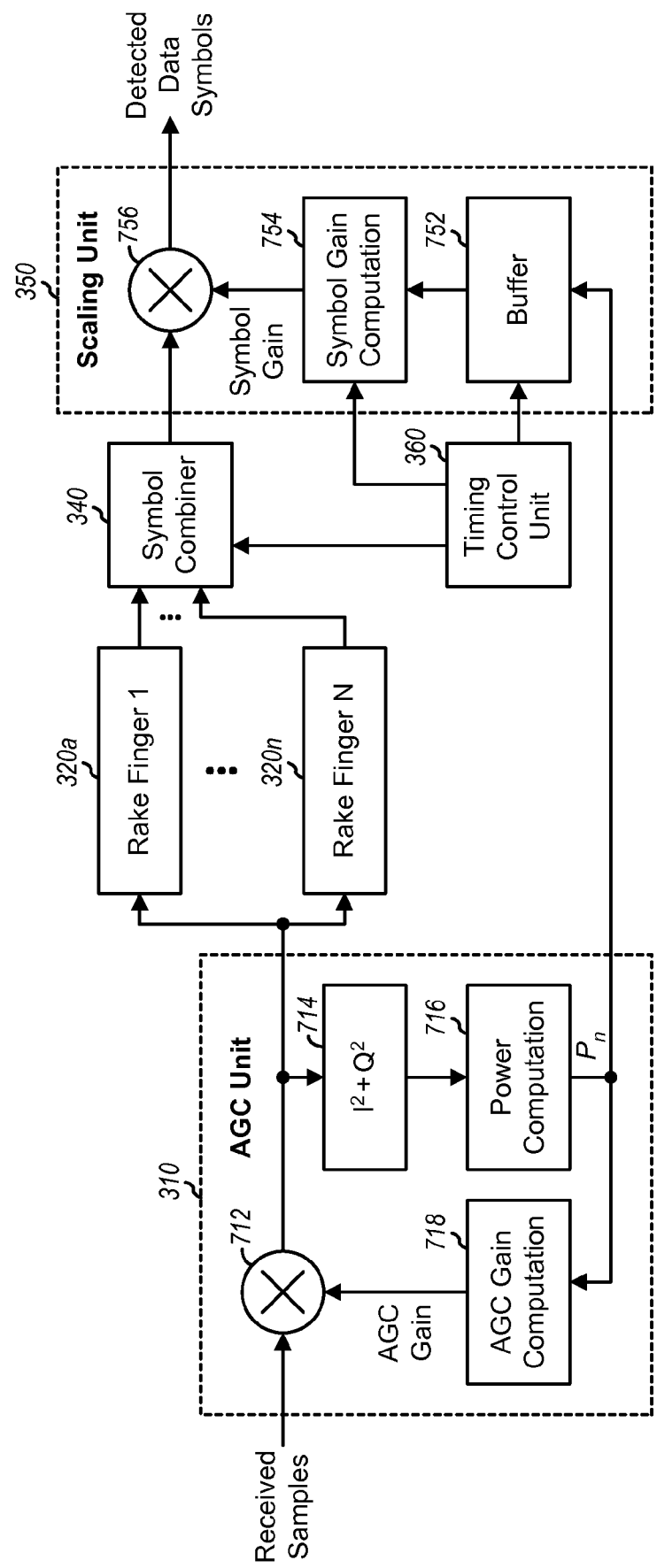
FIG. 7 shows a block diagram of an AGC unit and a scaling unit at the UE.

FIG. 7 shows a block diagram of a design of symbol scaling at UE 120x. In this design, the power of the samples provided by AGC unit 310 is computed in each time interval and used to scale the symbols from combiner 340. The time interval may be any suitably selected duration. In one design, the time interval spans 256 chip periods and is equal to the duration of one pilot symbol on the CPICH, which is spread with a 256-chip channelization code in W-CDMA. Other durations may also be selected for the time interval.

Within AGC unit 310, a multiplier 712 is provided with the received samples from receiver 254, scales the received samples in each time interval with an AGC gain $g_n$ for that time interval, and provides the input samples to rake fingers 320, where n is an index for time interval. A unit 714 computes the energy of each input sample. A unit 716 receives the energies of all input samples in each time interval and computes the received power for that time interval. The computation by units 714 and 716 may be expressed as:

$$P_n = \frac{1}{N} \sum_{k=1}^{N} (I_{n,k}^2 + Q_{n,k}^2), \qquad \text{Eq (2)}$$

where $I_{n,k}+j\, Q_{n,k}$ is the k-th input sample in time interval n,

N is the number of input samples in one time interval, and $P_n$ is the received power for the N input samples in time interval n.

The terms "power" and "energy" are related and are often used interchangeably.

An AGC gain computation unit 718 obtains the received power $P_n$ for each time interval and computes the AGC gain $g_n$ for the time interval. In each time interval, unit 718 may subtract the received power $P_n$ from the target power $P_{target}$ to obtain an error, filter the error with a loop filter, and derive the AGC gain $g_n$ based on the loop filter output. Multiplier 712 multiplies each received sample with the AGC gain $g_n$ and provides a corresponding input sample.

Within scaling unit 350, a buffer 752 receives and stores a power value $P_n$ provided by unit 716 in each time interval. Buffer 752 may be implemented with a circular buffer that stores the power value $P_n$ for the current time interval over the oldest power value in the buffer. Some processing delays are incurred for rake fingers 320 and symbol combiner 340. Buffer 752 stores the power values from unit 716 and provides appropriate power values for the symbols read out from combiner 340, as indicated by timing control unit 360.

In one design, a unit 754 receives a power value from buffer 752 in each time interval and computes an initial symbol gain, as follows:

$$\beta'_n = \beta_{nom} \cdot \frac{P_{target}}{P_n}, \qquad \text{Eq (3)}$$

where $\beta_{nom}$ is a nominal symbol gain, and $\beta'_n$ is the initial symbol gain for time interval n.

The nominal symbol gain $\beta_{nom}$ is a symbol gain that provides the proper amplitude for the detected data symbols when the received power $P_n$ is equal to the target power $P_{target}$. The initial symbol gain $\beta'_n$ is obtained by multiplying the nominal symbol gain $\beta_{nom}$ with a ratio $P_{target}/P_n$. $\beta'_n$ is thus inversely related to the received power $P_n$. When the received power $P_n$ jumps abruptly due to inability of AGC unit 310 to instantaneously track a large sudden change in received power at UE 120x, the symbol gain $\beta'_n$ is varied inversely by the received power $P_n$ and can reduce the amplitude of the symbols from combiner 340 by a corresponding amount. The symbol gain $\beta'_n$ is computed based on ratio $P_{target}/P_n$, instead of ratio $\sqrt{P_{target}/P_n}$, because the demodulated symbols from each rake finger 320 are obtained by weighting the despread data symbols from despreader 324 with the pilot estimates from filter 328, and both the data symbols and pilot estimates have powers that change with $P_n$.

In one design, unit 754 provides the nominal symbol gain $\beta_{nom}$ when the received power $P_n$ is within a predetermined range and provides the initial symbol gain $\beta'_n$ otherwise, as follows:

$$\beta_n = \begin{cases} \beta_{nom} & \text{if } P_{low} \le P_n \le P_{high} \\ \beta'_n & \text{otherwise} \end{cases} \qquad \text{Eq (4)}$$

where $P_{low}$ and $P_{high}$ are power values that define the predetermined range, and $\beta_n$ is the symbol gain for time interval n.

In general, $P_{low}$ and $P_{high}$ may be selected based on various factors such as the bit resolution of the samples provided by AGC unit 310, the target power $P_{target}$, the statistics of the samples from AGC unit 310, etc. $P_{low}$ and $P_{high}$ may be selected to cover a steady state range with expected random variations in $P_n$ due to noise. In one design, $P_{target}=18X$, $P_{low}=15X$, and $P_{high}=21X$, where X is dependent on the number of bits for the samples from AGC unit 310. Other values may also be used for $P_{target}$, $P_{low}$ and $P_{high}$.

A multiplier 756 receives the combined symbols from combiner 340 and the symbol gain $\beta_n$ from unit 754. Multiplier 756 scales each combined symbol with the symbol gain $\beta_n$ and provides a corresponding detected data symbol.

In the design shown in equation (4), either $\beta_{nom}$ or $\beta'_n$ may be selected in each time interval n based on $P_n$ and may be applied to the combined symbols from combiner 340. In this design, a large abrupt change in received power at UE 120x is detected by comparing $P_n$ against the predetermined range defined by $P_{low}$ and $P_{high}$. A large abrupt change in received power at UE 120x may also be detected in other manners, e.g., based on power values $P_n$ for multiple time intervals, based on the difference between power values, etc.

The design in FIG. 7 essentially inverts the transient at the output of AGC unit 310 and applies the inverted transient, with proper time alignment, at the output of symbol combiner 340. This design effectively provides an AGC that can track large abrupt changes in received power at UE 120x. The design also takes advantage of the inherent processing delays in rake fingers 320 and symbol combiner 340 and determines the symbol gain $\beta_n$ during the processing delays. The symbols from combiner 340 may be scaled with the symbol gain $\beta_n$ when these symbols are read out, without the need for additional buffering. The symbol scaling with the symbol gain $\beta_n$ may thus be performed with minimal impact to the operation of CDMA demodulator 260.

In general, the symbol gain $\beta_n$ and the AGC gain $g_n$ may be updated at the same rate or different rates. In one design, the gains $\beta_n$ and $g_n$ may be updated at the same rate in each time interval based on the received power $P_n$ of the samples from AGC unit 310, as described above. In this design, the transient at the output of AGC unit 310 varies by a discrete step in each time interval when the AGC gain $g_n$ is updated. The inverted transient applied at the output of combiner 340 may be varied by an opposite discrete step in each time interval when the symbol gain $\beta_n$ is updated.

In another design, the symbol gain $\beta_n$ may be updated at a slower rate than the AGC gain $g_n$. For example, the receive power $P_n$ may be computed over a first time interval of 256 chips, and the AGC gain $g_n$ may be updated in each first time interval. The combined symbols may be read out from combiner 340 in each second time interval of 512 chips, and the symbol gain $\beta_n$ may be updated in each second time interval. In each second time interval, two power values $P_n$ and $P_{n-1}$ for two first time intervals may be used to derive the symbol gain $\beta_{n/2}$ for that second time interval. The larger of $P_n$ and $P_{n-1}$ or the average of $P_n$ and $P_{n-1}$ may be used in equation (4) to compute $\beta'_{n/2}$, and $\beta_{n/2}$ may then be determined based on $\beta'_{n/2}$ as shown in equation (5). In yet another design, the symbol gain $\beta_n$ may be updated at a faster rate than the AGC gain $g_n$.

In general, the first time interval over which the received power $P_n$ and the AGC gain $g_n$ are computed may or may not be time aligned with the second time interval over which the combined symbols are read out from combiner 340. Each combined symbol may be scaled with the appropriate symbol gain $\beta_n$, which may be determined based on the received power $P_n$ computed with the same input samples used to derive that combined symbol. This may ensure that each combined symbol is scaled based on the received power for that combined symbol.

In the design shown in FIG. 7, the scaling to account for large abrupt changes in received power at UE 120x is performed on the combined symbols from combiner 340. In general, the scaling may be performed at any point after multiplier 712 in AGC unit 310. For example, the scaling may be performed on the samples from multiplier 712, on the demodulated symbols from rake fingers 320, on the combined symbols from symbol combiner 340, etc. Performing scaling after rake fingers 320 or after symbol combiner 340 may allow for computation of the symbol gain $\beta_n$ during the processing delays of these units, which may then avoid the need for additional buffering of the symbols. Furthermore, it may not be possible to perform scaling immediately after AGC unit 310 (before despreading) since the samples from the AGC unit may need to be processed in real time to obtain delay-sensitive information such as transmit power control (TPC) commands, transport format combination indicator (TFCI), etc.

Figure 8:
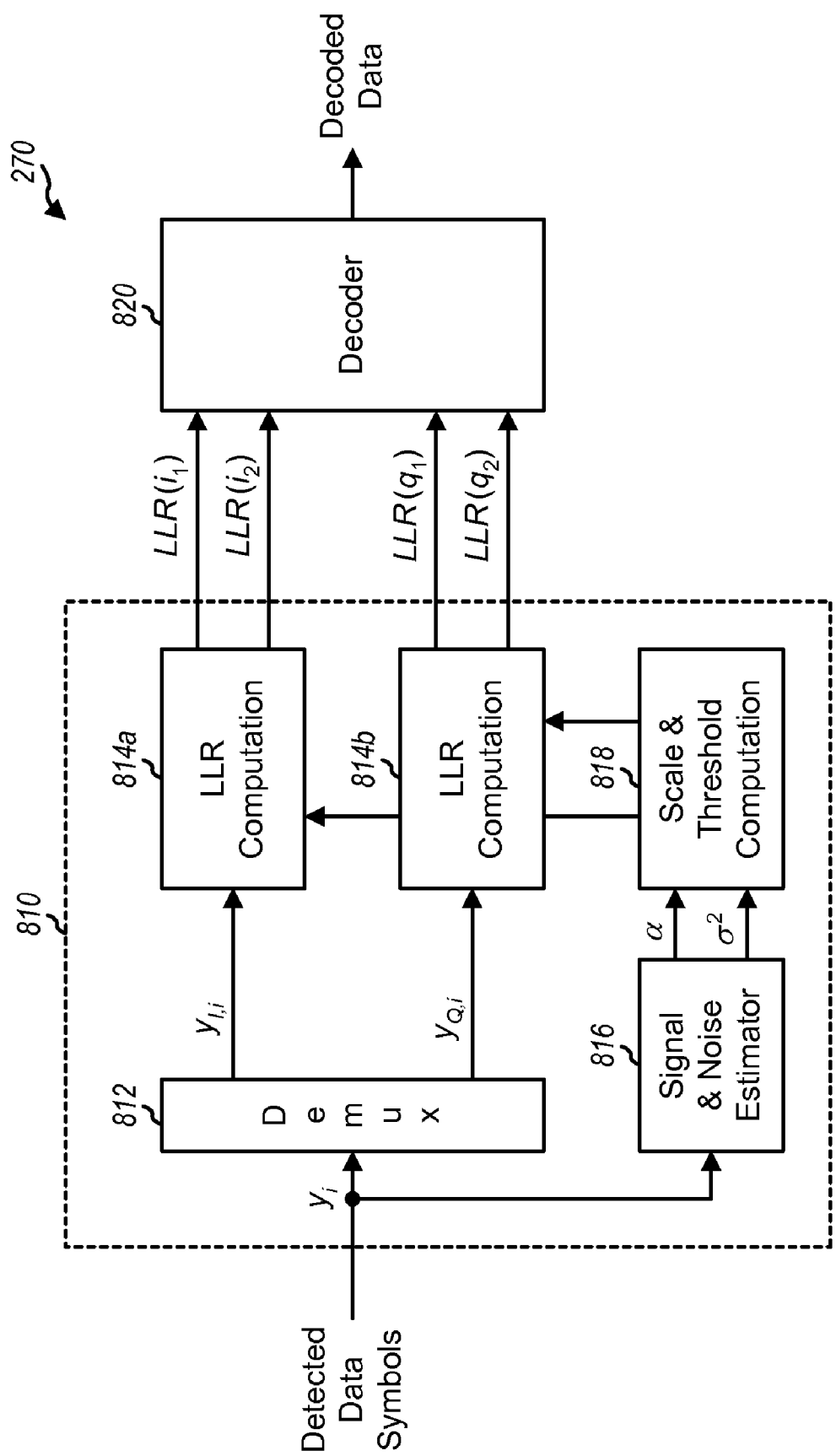
FIG. 8 shows a block diagram of a receive (RX) data processor at the UE.

FIG. 8 shows a block diagram of a design of RX data processor 270 at UE 120x in FIG. 2. In this design, RX data processor 270 includes an LLR computation unit 810 and a decoder 820. Within LLR computation unit 810, a demultiplexer (Demux) 812 receives the detected data symbols from CDMA demodulator 260, provides the real component $y_{I,i}$ of each detected data symbol to an LLR computation unit 814a, and provides the imaginary component $y_{Q,i}$ of each detected data symbol to an LLR computation unit 814b.

A signal and noise estimator 816 may estimate the mean of the absolute value of the detected data symbols, as follows:

$$m = \frac{1}{2T} \cdot \sum_{i=1}^{T} \{|y_{I,i}| + |y_{Q,i}|\}, \quad \text{Eq (5)}$$

where $y_{I,i} + j\, y_{Q,i}$ is the i-th detected data symbol, m is the mean of the absolute value of the detected data symbol components, and T is the number of detected data symbols used to estimate the mean.

T may be equal to the number of data symbols in one half subframe, which is 80 symbols for HSDPA. T may also be equal to some other number of data symbols.

Signal and noise estimator 816 may also estimate the average energy of the detected data symbol components, as follows:

$$E = \frac{1}{2T} \cdot \sum_{i=1}^{T} \{|y_{I,i}^2| + |y_{Q,i}^2|\}, \quad \text{Eq (6)}$$

where E is the average energy of the detected data symbol components. As shown in equations (5) and (6), m and E are dependent on the amplitude of the detected data symbols from CDMA demodulator 260. Thus, m and E may benefit from the symbol scaling performed to account for large abrupt changes in received power at UE 120x, so that the quantities of interest are roughly constant during the estimation period.

Signal and noise estimator 816 may map the mean m and the average energy E to signal amplitude $\alpha$ and noise variance $\sigma^2$. For 16-QAM, which is one of the modulation schemes used for HSDPA, each of the 16 possible modulation symbols may have a real/inphase (I) component value of $-3\alpha$, $-\alpha$, $\alpha$ or $3\alpha$ and an imaginary/quadrature (Q) component value of $-3\alpha$, $-\alpha$, $\alpha$ or $3\alpha$. Four code bits (which are obtained after encoding and rate matching) may be mapped to a modulation symbol, with two code bits $i_1$ and $i_2$ defining the I component value and two code bits $q_1$ and $q_2$ defining the Q component value of the modulation symbol.

A unit 818 may compute scale factor(s) and/or scaled threshold(s) based on $\alpha$ and $\sigma^2$ from signal and noise estimator 816. For 16-QAM, unit 818 may compute a scale factor u and a scaled threshold v based on $\alpha$ and $\sigma^2$, as follows:

$$u = 2\alpha/\sigma^2, \text{ and} \quad \text{Eq (7)}$$

$$v = 4\alpha^2/\sigma^2 \quad \text{Eq (8)}$$

Unit 818 may provide the scale factor u and the scaled threshold v to both LLR computation units 814a and 814b.

LLR computation units 814a and 814b may compute the LLRs for the code bits of the I and Q components, respectively, of the detected data symbols. In one design, each unit 814 computes the LLRs based on piecewise linear approximations of the LLR functions for the two code bits. For 16-QAM, unit 814a may compute the LLRs for the two code bits $i_1$ and $i_2$ of the I component, as follows:

$$z_{I,i} = u \cdot y_{I,i}, \quad \text{Eq (9)}$$

$$LLR(i_1) = \begin{cases} 2z_{I,i} + v & \text{if } z_{I,i} < -v \\ z_{I,i} & \text{if } -v \leq z_{I,i} < v, \\ 2z_{I,i} - v & \text{if } z_{I,i} \geq v \end{cases} \quad \text{Eq (10)}$$

$$LLR(i_2) = v - |z_{I,i}|, \quad \text{Eq (11)}$$

where $LLR(i_1)$ and $LLR(i_2)$ are the LLRs for code bits $i_1$ and $i_2$, respectively. Unit 814b may compute $LLR(q_1)$ and $LLR(q_2)$ for code bits $q_1$ and $q_2$, respectively, in the same manner as unit 814a.

Figure 9:
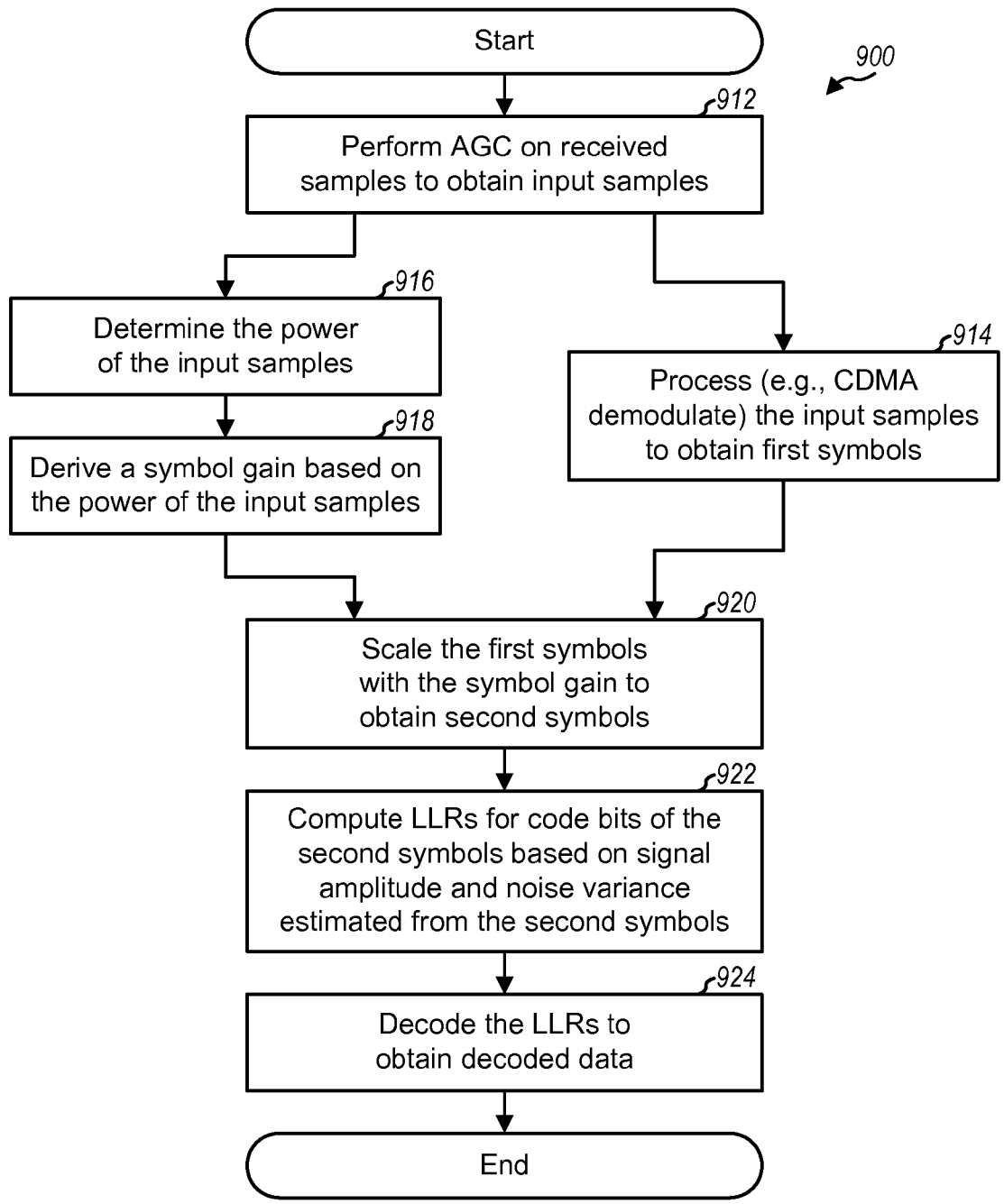
FIG. 9 shows a process to receive downlink transmission by the UE.

Equations (7) through (11) may be used for LLR computation for the 16-QAM signal constellation used for HSDPA. In general, the scale factor(s), scaled threshold(s), and LLR functions may be dependent on the signal constellation used to generate the data symbols. The scale factor(s) and scaled threshold(s) may be computed based on $\alpha$ and $\sigma^2$, which may be estimated based on the detected data symbols. The scaling techniques described herein may improve the estimates of $\alpha$ and $\sigma^2$, which may improve the accuracy of the scale factor(s) and scaled threshold(s). This may in turn improve the quality of the LLRs, which may then improve decoding performance. The scaling techniques may be used to avoid warping of the signal constellation due to large abrupt changes in received power at UE 120x and may improve decoding performance for modulation schemes of higher order than QPSK FIG. 9 shows a design of a process 900 performed by a UE to process a downlink transmission. AGC may be performed on received samples to obtain input samples (block 912). For AGC, the received samples in each time interval may be scaled with an AGC gain for that time interval to obtain the input samples. The power of the input samples in each time interval may be determined and used to update the AGC gain.

The input samples may be processed to obtain first symbols (block 914). The processing may be dependent on the radio technology used by the system. For CDMA, the input samples may be descrambled with a scrambling sequence for a Node B to obtain descrambled samples. The descrambled samples may be despread with at least one channelization code to obtain despread data symbols. The descrambled samples may also be despread with a pilot channelization code to obtain despread pilot symbols, which may be filtered to obtain pilot estimates. The despread data symbols may be coherently demodulated/detected with the pilot estimates to obtain demodulated symbols for a multipath. The input samples may be processed for more than one multipath, and the demodulated symbols for all multipaths may be combined to obtain the first symbols. The input samples may be processed in other manners for other radio technologies.

The power of the input samples may be determined (block 916). For block 916, the power of the input samples in each time interval may be determined, e.g., as shown in equation (2). Multiple power values may be obtained for multiple time intervals and stored in a buffer.

A symbol gain may be derived based on the power of the input samples (block 918). The symbol gain may be derived based on a nominal symbol gain, the power of the input samples, and a target power for the input samples, e.g., as shown in equation (3). The symbol gain may be inversely related to the power of the input samples and may be derived to achieve approximately constant symbol amplitude after scaling, even in the presence of large abrupt changes in the power of the input samples. The symbol gain may be (1) set to the nominal symbol gain if the power of the input samples is within a predetermined range or (2) inversely related to the power of the input samples if the power is outside of the predetermined range, e.g., as shown in equation (4).

In one design of block 918, for each set of first symbols, at least one power value applicable to that set may be obtained from among the stored power values and used to derive the symbol gain for that set of first symbols. Each set of first symbols may correspond to one time interval over which the power of the input samples is computed. In this case, the symbol gain for each set of first symbols may be derived based on one power value obtained for the corresponding time interval.

The first symbols may be scaled with the symbol gain to obtain second symbols (block 920). In the design shown in FIGS. 3 and 7, the first symbols may correspond to the symbols from combiner 340, and the second symbols may correspond to the detected data symbols from CDMA demodulator 260. The first and second symbols may be other symbols in a demodulator. LLRs may be computed for code bits of the second symbols based on signal amplitude and noise variance estimated from the second symbols (block 922). The LLRs may be decoded to obtain decoded data for the UE (block 924).

The scaling techniques described herein may be used to combat various phenomena. The techniques may be used to combat large abrupt changes in cell power, which may be due to a high power UE with intermittent scheduling pattern. Such intermittent scheduling pattern may result from instant messenger, text terminal, ping applications, etc. The large abrupt changes in cell power may impact all UEs in the cell, since these UEs may receive the same downlink transmission from the cell and observe the large abrupt changes in cell power. UEs in good channel conditions may observe more of the large abrupt changes in cell power because less noise may be present to dampen the jump in cell power. In addition, the large abrupt changes in cell power may impact higher order modulation schemes (e.g., 16-QAM, 64-QAM, etc.) more than QPSK, since the estimation process for LLR parameters is more involved and more sensitive to noise for higher order modulation schemes. As a result, high throughput UEs (e.g., those in good channel conditions and/or using higher order modulation schemes) may particularly benefit from the techniques described herein. The techniques may also be used to combat deep fades observed by a UE due to poor channel conditions. The techniques may also be used to combat large abrupt changes in received power at a UE due to large variations in cell powers of non-serving Node Bs and/or due to other causes.

The scaling techniques described herein may be implemented by various means. For example, these techniques may be implemented in hardware, firmware, software, or a combination thereof. For a hardware implementation, the processing units used to perform the techniques may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with modules (e.g., procedures, functions, etc.) that perform the functions described herein. The firmware and/or software instructions may be stored in a memory (e.g., memory 282 in FIG. 2) and executed by a processor (e.g., processor 280). The memory may be implemented within the processor or external to the processor. The firmware and/or software instructions may also be stored in other processor-readable medium such as random access memory (RAM), read-only memory (ROM), non-volatile random access memory (NVRAM), programmable read-only memory (PROM), electrically erasable PROM (EEPROM), FLASH memory, compact disc (CD), magnetic or optical data storage device, etc.

An apparatus implementing the techniques described herein may be a stand-alone unit or may be part of a device. The device may be (i) a stand-alone integrated circuit (IC), (ii) a set of one or more ICs that may include memory ICs for storing data and/or instructions, (iii) an ASIC such as a mobile station modem (MSM), (iv) a module that may be embedded within other devices, (v) a cellular phone, wireless device, handset, or mobile unit, (vi) etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
   a processor configured to process input samples to obtain first symbols, to determine power of the input samples, to derive a symbol gain based on the power of the input samples, to scale the first symbols with the symbol gain to obtain second symbols, to estimate signal amplitude and noise variance based on the second symbols, and to compute log likelihood ratios (LLRs) for code bits of the second symbols based on the signal amplitude and noise variance; and a memory coupled to the processor.

2. The apparatus of claim 1, wherein the processor is configured to perform automatic gain control (AGC) on received samples to obtain the input samples.

3. The apparatus of claim 2, wherein in each of multiple time intervals, the processor is configured to scale received samples in the time interval with an AGC gain to obtain input samples for the time interval, to determine power of the input samples in the time interval, and to update the AGC gain based on the power of the input samples.

4. The apparatus of claim 1, wherein the processor is configured to derive the symbol gain to be inversely related to the power of the input samples.

5. The apparatus of claim 1, wherein the processor is configured to derive the symbol gain further based on a nominal symbol gain and a target power for the input samples.

6. The apparatus of claim 1, wherein the processor is configured to set the symbol gain to a nominal symbol gain if the power of the input samples is within a predetermined range, and to derive the symbol gain to be inversely related to the power of the input samples if the power is outside of the predetermined range.

7. The apparatus of claim 1, wherein the processor is configured to derive the symbol gain to achieve approximately constant amplitude for the second symbols.

8. The apparatus of claim 1, wherein the processor is configured to determine power of the input samples in each of multiple time intervals and obtain multiple power values for the multiple time intervals, and to derive the symbol gain based on the multiple power values for the multiple time intervals.

9. The apparatus of claim 8, wherein the memory is configured to store the multiple power values to time align the symbol gain with the first symbols.

10. The apparatus of claim 8, wherein for each of multiple sets of first symbols, the processor is configured to obtain at least one power value applicable to the set of first symbols from among the multiple power values, and to derive the symbol gain for the set of the first symbols based on the at least one power value.

11. The apparatus of claim 10, wherein each set of first symbols corresponds to one time interval, and wherein the symbol gain for each set of first symbols is derived based on a power value obtained for a corresponding time interval.

12. The apparatus of claim 1, wherein the signal amplitude and noise variance are estimated based on a predetermined number of second symbols, wherein the processor is further configured to determine a scale factor and a scaled threshold based on the signal amplitude and the noise variance, and wherein the log likelihood ratios (LLRs) are computed for code bits of the predetermined number of second symbols based on the scale factor and the scaled threshold.

13. The apparatus of claim 1, wherein the processor is configured to perform demodulation on the input samples to obtain demodulated symbols for at least one multipath, and to combine the demodulated symbols for the at least one multipath to obtain the first symbols.

14. The apparatus of claim 13, wherein for each multipath the processor is configured to descramble the input samples with a scrambling sequence to obtain descrambled samples, to despread the descrambled samples with at least one channelization code to obtain despread data symbols, to despread the descrambled samples with a pilot channelization code to obtain despread pilot symbols, to filter the despread pilot symbols to obtain pilot estimates, and to perform coherent demodulation on the despread data symbols with the pilot estimates to obtain demodulated symbols for the multipath.

15. A method comprising:
processing, at a wireless communications device, input samples to obtain first symbols;
determining, at the wireless communications device, power of the input samples;
deriving, at the wireless communications device, a symbol gain based on the power of the input samples;
scaling, at the wireless communications device, the first symbols with the symbol gain to obtain second symbols;
estimating, at the wireless communications device, signal amplitude and noise variance based on the second symbols; and
computing, at the wireless communications device, log likelihood ratios (LLRs) for code bits of the second symbols based on the signal amplitude and the noise variance.

16. The method of claim 15, further comprising:
performing automatic gain control (AGC) on received samples to obtain the input samples.

17. The method of claim 15, wherein the deriving the symbol gain comprises deriving the symbol gain to be inversely related to the power of the input samples.

18. The method of claim 15, wherein the deriving the symbol gain comprises
setting the symbol gain to a nominal symbol gain if the power of the input samples is within a predetermined range, and
deriving the symbol gain to be inversely related to the power of the input samples if the power is outside of the predetermined range.

19. An apparatus comprising:
means for processing input samples to obtain first symbols;
means for determining power of the input samples;
means for deriving a symbol gain based on the power of the input samples;
means for scaling the first symbols with the symbol gain to obtain second symbols;
means for estimating signal amplitude and noise variance based on the second symbols; and
means for computing log likelihood ratios (LLRs) for code bits of the second symbols based on the signal amplitude and the noise variance.

20. The apparatus of claim 19, further comprising:
means for performing automatic gain control (AGC) on received samples to obtain the input samples.

21. The apparatus of claim 19, wherein the means for deriving the symbol gain comprises
means for deriving the symbol gain to be inversely related to the power of the input samples.

22. The apparatus of claim 19, wherein the means for deriving the symbol gain comprises
means for setting the symbol gain to a nominal symbol gain if the power of the input samples is within a predetermined range, and
means for deriving the symbol gain to be inversely related to the power of the input samples if the power is outside of the predetermined range.

23. A processor-readable medium including instructions stored thereon, comprising:
a first instruction set for processing input samples to obtain first symbols;
a second instruction set for determining power of the input samples;

a third instruction set for deriving a symbol gain based on the power of the input samples;

a fourth instruction set for scaling the first symbols with the symbol gain to obtain second symbols;

a fifth instruction set for estimating signal amplitude and noise variance based on the second symbols; and a sixth instruction set for computing log likelihood ratios (LLRs) for code bits of the second symbols based on the signal amplitude and the noise variance.

24. The processor-readable medium of claim 23, further comprising:

a seventh instruction set for performing automatic gain control (AGC) on received samples to obtain the input samples.

25. The processor-readable medium of claim 23, wherein the third instruction set comprises:

a seventh instruction set for deriving the symbol gain to be inversely related to the power of the input samples.

26. The processor-readable medium of claim 23, wherein the third instruction set comprises:

a seventh instruction set for setting the symbol gain to a nominal symbol gain if the power of the input samples is within a predetermined range, and an eighth instruction set for deriving the symbol gain to be inversely related to the power of the input samples if the power is outside of the predetermined range.

* * * * *